(12) United States Patent
Ide et al.

(10) Patent No.: US 6,875,488 B2
(45) Date of Patent: Apr. 5, 2005

(54) OPTICAL INFORMATION RECORDING MEDIUM

(75) Inventors: Tatsunori Ide, Tokyo (JP); Eiji Kariyada, Tokyo (JP); Shuichi Ohkubo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/408,441

(22) Filed: Apr. 8, 2003

(65) Prior Publication Data

US 2003/0190449 A1 Oct. 9, 2003

(30) Foreign Application Priority Data

Apr. 9, 2002 (JP) ........................................ 2002-106448

(51) Int. Cl.⁷ ................................................ B32B 3/02
(52) U.S. Cl. ................. 428/64.1; 428/64.4; 430/270.12
(58) Field of Search ............................. 428/64.1, 64.4, 428/64.5, 457, 913; 430/270.13, 495.1, 945

(56) References Cited

U.S. PATENT DOCUMENTS

| 4,839,883 A | * | 6/1989 | Nagata et al. ............... 369/286 |
| 5,583,840 A | * | 12/1996 | Minemura et al. ........... 369/100 |
| 5,846,626 A | | 12/1998 | Kashiwagi et al. |
| 6,159,572 A | * | 12/2000 | Kobayashi et al. ......... 428/64.1 |
| 2002/0012604 A1 | | 1/2002 | Aratani et al. |

FOREIGN PATENT DOCUMENTS

| JP | 8-235638 | 9/1996 |
| JP | 11-120613 | 4/1999 |
| JP | 2000-109943 A | 4/2000 |

* cited by examiner

*Primary Examiner*—Elizabeth Mulvaney
(74) *Attorney, Agent, or Firm*—Foley & Lardner LLP

(57) ABSTRACT

An optical information recording medium is provided that records and reproduces information by means of laser beams irradiated from the side of the light transmission layer. The optical information recording medium provides a large capacity and a high degree of reliability and is inexpensive. At least a reflective film and a light transmission layer are formed, in the presented order, on the information recording surface of the support substrate. Information is recorded and/or reproduced by using the laser beam irradiated from the side of the light transmission layer. The reflective film, which is made of an alloy containing Ni and Cr as main components, has a thickness of 20 nm or more to 80 nm or less.

2 Claims, 4 Drawing Sheets

OPTICAL INFORMATION RECORDING MEDIUM

BACKGROUND OF THE INVENTION

The present invention relates to an optical information recording medium, on which at least a reflective film and a light transmission layer are laminated, in the presented order, on the information recording surface of a support substrate, for recording and/or reproducing information on the information recording surface by a laser beam irradiated through the light transmission layer. More particularly, the present invention relates to an optical information recording medium, on which a first recording layer, an intermediate layer, a second recording layer, and a light transmission layer are laminated, in the presented order, on the information recording surface of a support substrate, for recording and/or reproducing information on the information recording surface by a laser beam irradiated through the light transmission layer.

In a prior art, JP-P1996-235638A proposes the method of setting the substrate to a thickness of about 0.1 mm. This relates to the method for increasing the numerical aperture (NA) of an objective lens to realize a high-density, high-capacity optical disc, and thus ensuring the tilt margin, which reduces because of the increased numerical aperture (NA). However, in such a method, it is difficult to maintain the shape of the 0.1 mm-thick substrate itself. For that reason, in the case of the reproduction-only optical discs, a reflective film is formed on a support substrate having guide grooves or information signal sections, like the conventional substrate. In the case of the rewritable optical discs, a combination of a reflective film and a phase changing film, or a magneto optical film, or a protective film is formed on the support substrate. Moreover, an optical transmission layer of about 0.1 mm in thickness is formed on the intermediate structure. Thus, information is recorded and/or reproduced by irradiating laser beams from the optical transmission layer side.

Aluminum alloys, such as Al—Ti and Al—Cr, have been broadly used for the optical information recording media of the type such as CDs, DVDs, CD-Rs, or CD-RWs, in which laser beams are irradiated onto the reflective film from the support substrate side. In this case, coarse grains are formed on the aluminum alloy film as the reflective film grows, thus making rough surfaces thereon. Because laser beams are irradiated from the side of the optical transmission layer formed on the reflective film to record or reproduce information, the rough surfaces cause large noises. Therefore, the problem is that the noises become an obstacle to high-density recording.

In order to solve such a problem, JP-P1999-120613A discloses the method for using an A6061 alloy, in which Mg or Si is added to Al, and forming the alloy through the ion beam sputtering method. However, merely using the A6061 alloy in the conventional ion sputtering method results in an insufficient noise reduction effect or the film formation in the ion-beam sputtering method results in a complicated production apparatus, so that the medium becomes costly.

Furthermore, JP-P2000-109943A discloses that an alloy containing Ag acting as a principal component, Pd, Cu, and Cr is used. This method can provide a high noise reduction effect, but tends to generate sulfuration and has a large problem on corrosion resistance. Particularly, the phase change optical disc has the problem in that when common $ZnS$—$SiO_2$ is used as a protective film, sulfuration causes corrosion.

SUMMARY OF THE INVENTION

The present invention is made to solve the above-mentioned problems. An object of the present invention is to provide an optical information recording medium, on which at least a reflective film and a light transmission layer are laminated, in the presented order, on the information recording surface of a support substrate, for recording and/or reproducing information by a laser beam irradiated from the side of the light transmission layer. The reflective film provides a low noise and a good corrosion resistance and is inexpensive.

According to the present invention, an optical information recording medium comprises at least a reflective film and a light transmission layer, formed, in the presented order, on an information recording surface of a support substrate on which information are previously created in pit lines, wherein information is reproduced by means of a laser beam irradiated from the side of the light transmission layer, the reflective film being an alloy containing Ni and Cr acting as main components, the reflective film having a thickness of 20 nm or more to 80 nm or less.

In another aspect of the present invention, an optical information recording medium comprises at least a reflective film, a recording film, and a light transmission layer, formed, in the presented order, on a support substrate, wherein information is recorded and/or reproduced by means of a laser beam irradiated from the side of the light transmission layer, the reflective film being an alloy containing Ni and Cr acting as main components, the reflective film having a thickness of 20 nm or more to 80 nm or less.

In the optical information recording medium, the reflective film comprises Ni and Cr and the Ni has a content of 60 wt % to 90 wt %.

In another aspect of the present invention, an optical information recording medium comprises a first recording layer formed of a first pit line and a first reflective film, an intermediate layer, a second recording layer formed of a second pit line and a second reflective film, and a light transmission layer, formed in the presented order, on a support substrate, wherein information is recorded and/or reproduced by means of a laser beam irradiated from the side of the light transmission layer, the first reflective film being an alloy containing Ni and Cr as main components, the reflective film having a thickness of 20 nm or more to 80 nm or less. The second bit line may be formed on the intermediate layer or on the light transmission layer. When the second pit line is formed on the intermediate layer, both the second reflective film and the light transmission layer may be successively formed over the pit line in the intermediate layer. When the second pit line is formed on the light transmission layer, the second reflective film may be successively formed over the pit line in the light transmission film. Thereafter, the intermediate layer may be formed between the first reflective film and the second reflective film.

According to another aspect of the present invention, an optical information recording medium comprises a first recording layer, an intermediate layer, a second recording layer, and a light transmission layer, formed, in the presented order, on a support substrate, wherein information is recorded and/or reproduced by means of a laser beam irradiated from the side of the light transmission layer, the first recording layer having at least a reflective film and a recording film, the reflective film being an alloy containing Ni and Cr as main components, said reflective film having a thickness of 20 nm or more to 80 nm or less.

In the optical information recording medium, the reflective film comprises Ni and Cr and the Ni has a content of 60 wt % to 90 wt %.

According to the present invention, an alloy containing Ni and Cr as principal components is used as the reflective layer, so that an inexpensive, high corrosion resistant reflective layer can be realized. The reflective layer, which has a thickness of 20 nm to 80 nm, enables noise reduction, thus recording and/or reproducing high-density, large-capacity information.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

Embodiments according to the present invention will be described below in detail by referring to the attached drawings.

Figure 1:
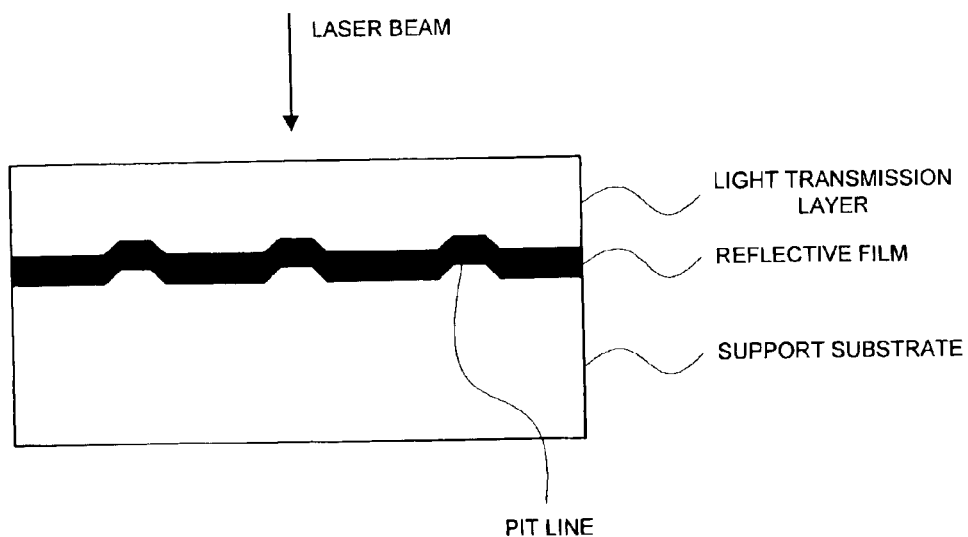
FIG. 1 is a cross sectional view illustrating a reproduction-only optical information recording medium according to the present invention.

FIG. 1 is a cross sectional view illustrating an optical information recording medium according to the present invention.

Referring to FIG. 1, a reflective film is formed over an information recording surface of a support substrate. A light transmission layer is formed on the reflective film. The reflective film is formed of an alloy containing Ni and Cr acting as principal components and has its thickness of 20 nm to 80 nm. A material such as polycarbonate (PC), polyolefin, glass, or aluminum may be used for the support substrate. Pit lines and guide grooves, each corresponding to information signals, may be formed on the information recording surface of the support substrate. The thickness of the light transmission layer is about 0.1 mm. The light transmission layer may be adhered with a PC film, using an UV cure resin or an adhesive sheet. A transparent film, which has a thickness of about 0.1 mm, may be formed with an UV cure resin.

Figure 2:
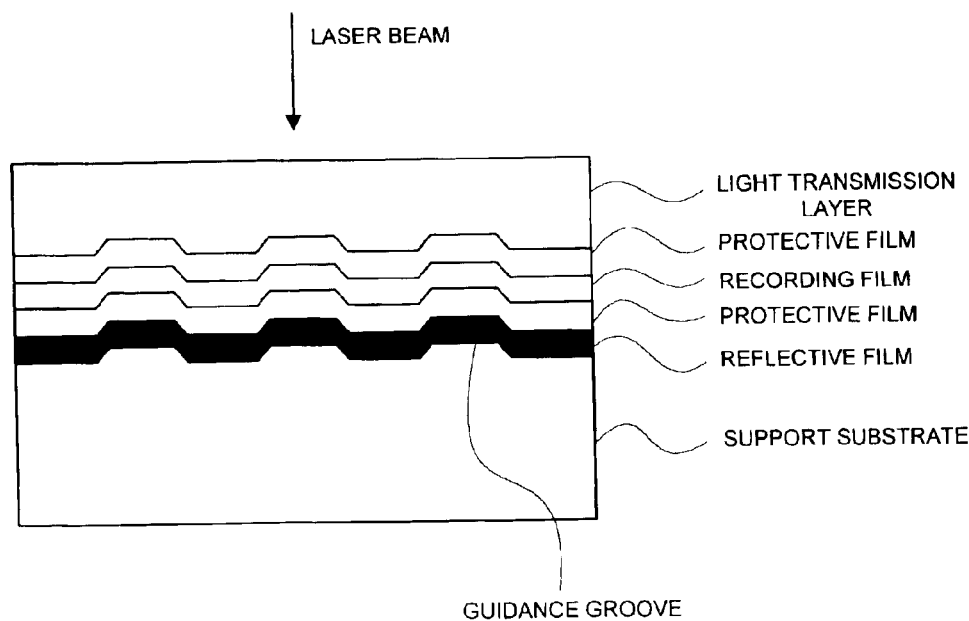
FIG. 2 is a cross sectional view illustrating a phase change optical disc as an example of a rewritable optical information recording medium according to the present invention.

FIG. 2 is a cross sectional view illustrating a phase change optical disc being a rewritable optical information recording medium according to a first embodiment of the present invention.

A reflective layer, a first protective layer, a recording layer, a second protective layer, and a light transmission layer are successively formed over the information recording surface of a support substrate, in which guide grooves are formed. The recording layer changes its optical properties due to differences in thermal history between a temperature rise by laser beams irradiated from the light transmission layer side and cooling. Magneto optical discs and write-once optical information recording media using an organic dye may be cited as rewritable optical information recording media according to other embodiments. The present invention may be also applicable to multi-tiered optical information recording media having two or more information recording layers.

Embodiment 1

A PC substrate, which has a thickness of 1.2 mm, an outer diameter of 120 mm, and an inner diameter of 15 mm and on which guide grooves having a pitch of 0.6 $\mu$m (a land/groove recording pitch of 0.3 $\mu$m) are formed, is prepared as a support substrate. A 80 wt % Ni-20 wt % Cr alloy reflective film having a thickness of 20 nm to 100 nm, a ZnS—SiO$_2$ protective film having a thickness of 45 nm, a Ge$_2$Sb$_2$Te$_5$ recording film having a thickness of 14 nm, and a ZnS—SiO$_2$ protective film having a thickness of 105 nm are successively laminated on the support substrate by using the sputtering method. A PC film having a thickness of 0.1 mm is disposed as a light transmission layer over the laminated structure and is adhered together using an UV cure resin. Thus, an optical information recording medium is completed. Similarly, a 80 wt % Ni-20 wt % Cr alloy reflective film having a thickness of 10 nm, a ZnS—SiO$_2$ protective film having a thickness of 30 nm, a Ge$_2$Sb$_2$Te$_5$ recording film having a thickness of 14 nm, and a ZnS—SiO$_2$ protective film having a thickness of 55 nm are stacked up over the support substrate by using the sputtering method. Thereafter, a light transmission layer is formed on the laminated structure. Thus, an optical information recording medium is fabricated.

COMPARATIVE EXAMPLE 1

In a manner similar to that of the first embodiment, an optical information recording medium is fabricated. However, a protective film, formed of Al-0.9 wt % Ti (where Ti is 0.9 wt % and the remainder is Al), having a thickness of 20 nm to 80 nm is first prepared. A ZnS—SiO$_2$ protective film having a thickness of 45 nm, a Ge$_2$Sb$_2$Te$_5$ recording film having a thickness of 14 nm, a ZnS—SiO$_2$ protective film having a thickness of 105 nm are successively deposited on the protective film, by using the sputtering method.

COMPARATIVE EXAMPLE 2

In a manner similar to that of the second embodiment, the optical information recording medium can be fabricated. However, a reflective film, which is formed of an Ag-0.5 wt % Pd-0.5 wt % Cu (where Pd is 0.5 wt %, Cu is 0.5 wt %, and the remainder is Ag) and which has a film thickness of 100 nm, is prepared. A ZnS—SiO$_2$ protective film of 35 nm in thickness, a Ge$_2$Sb$_2$Te$_5$ recording film of 14 nm in thickness, and a ZnS—SiO$_2$ protective film of 95 nm in thickness are successively deposited by using the sputtering method and laminated in the order described here over the reflective film.

Figure 3:
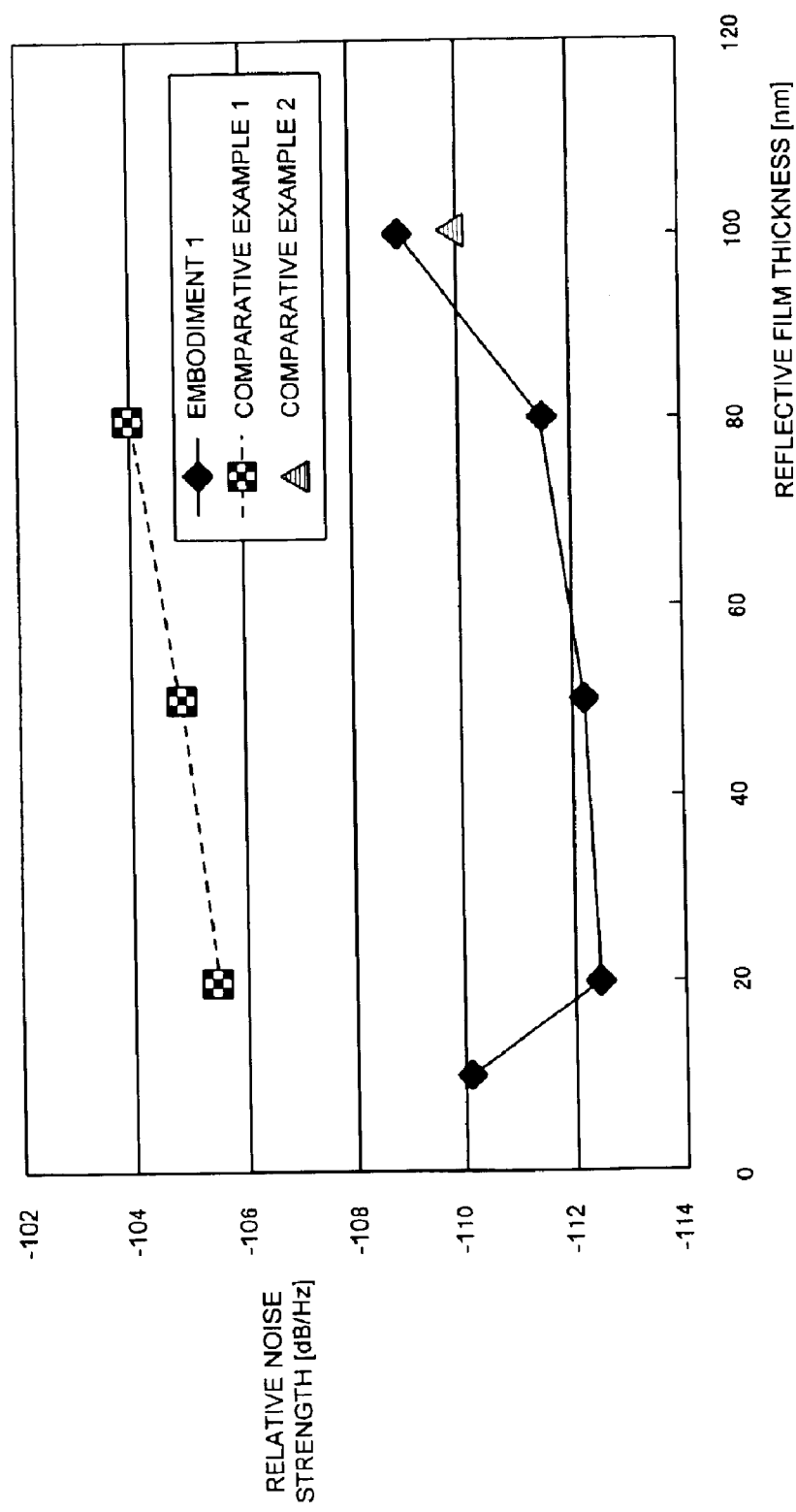
FIG. 3 is a graph plotting relationships between a reflective film thickness and a relative noise strength in a phase change rewritable optical information recording medium according to the present invention.

FIG. 3 shows measured relative noise strengths (RIN) of an optical information recording medium using reflective films of three types described above. In the measurement, an optical head with an objective lens of which NA is 0.85 and the wavelength is 405 nm, is used. The relative noise strengths are measured at a frequency of 4 MHz while the optical information recording medium is spinning at a linear velocity of 5.5 m/s.

As to the medium using a NiCr reflective film, the noise is low when the thickness of the reflective film ranges 20 nm to 80 nm. However, the noise sharply increases when the thickness of the reflective film is 10 nm or 100 nm. The medium using an AlTi reflective film indicates that the noise is very large even if the thickness of the reflective film is as thin as 20 nm to 80 nm. As to the medium using an AgPdCu reflective film, the noise is low even at the large thickness of 100 nm, compared with the NiCr reflective film having a thickness of 100 nm.

Figure 4:
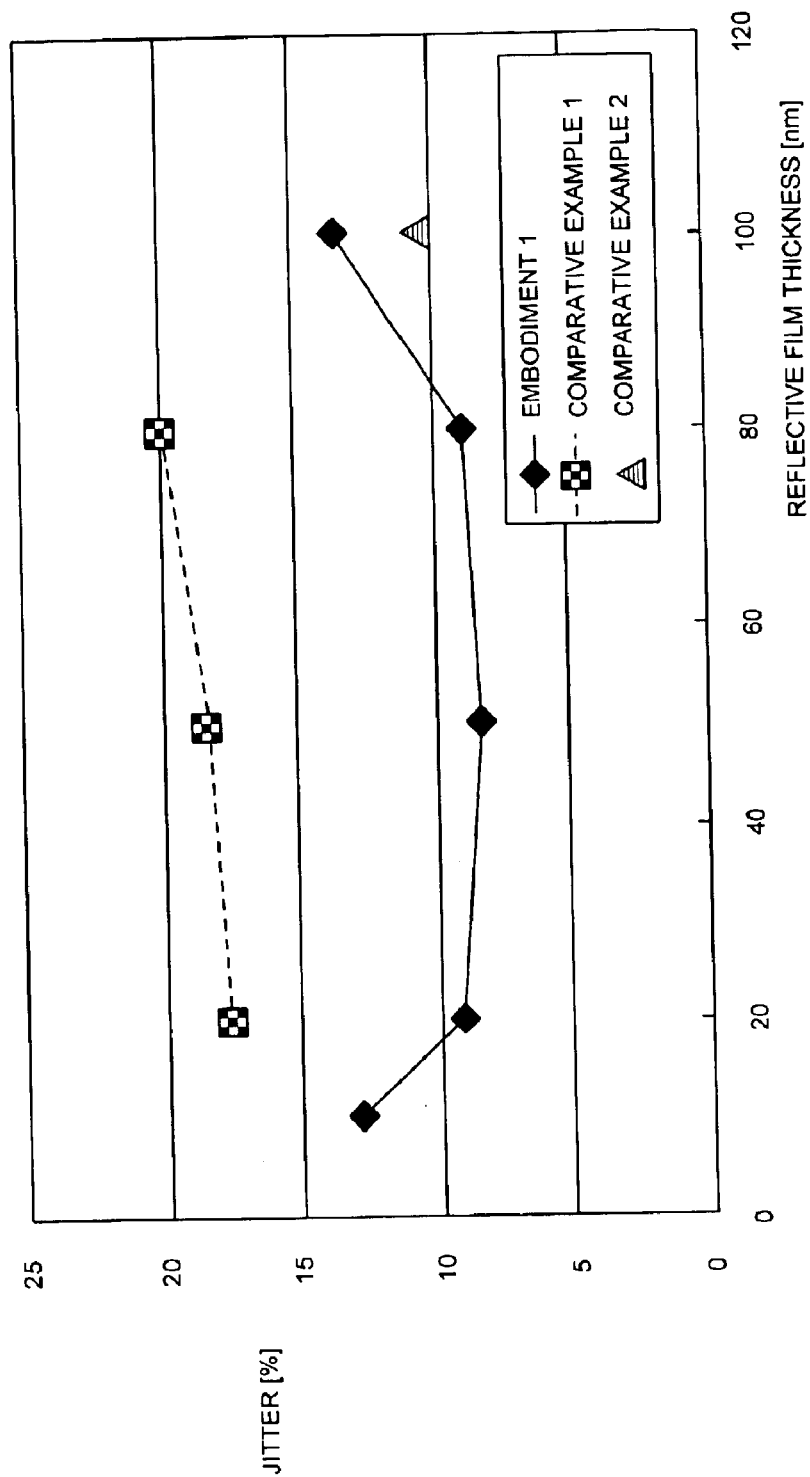
FIG. 4 is a graph plotting relationships between a reflective film thickness and a jitter in a phase change rewritable optical information recording medium according to the present invention.

The media using the reflective films of the three types described above are initialized (that is, each recording film is crystallized). Then, each medium is rotated at a linear velocity of 5.5 m/s. An optical head with an objective lens, of which NA is 0.85 and a wavelength is 405 nm, is prepared. The optical head records information to the medium on condition that a linear density is 0.116 $\mu$m/bit, thus measuring jitters. FIG. 4 shows the measured results.

As a result, the medium using the NiCr reflective film provides large jitter at a film thickness of 10 nm or 100 nm but provides good jitter in the range of 20 nm to 80 nm in film thickness. When the reflective film has a thickness of 10 nm or 100 nm, a large jitter is caused by the high noise as shown in FIG. 3. In the medium using the AlTi reflective film, the jitter is hardly improved even if the reflective film thickness is thinned to 20 nm to 80 nm. In the medium using the AgPdCu reflective film, even if the reflective film is thickened to 100 nm, good jitter can be obtained, compared with the NiCr reflective film having a thickness of 100 nm.

Moreover, information is recorded to each of the media using the reflective films of three types described above, at a linear density of 0.116 $\mu$m/bit. Then, the medium is maintained for 1000 hours at 80° C. and at a relative humidity of 85%. Thereafter the information is reproduced and jitters are measured.

As a result, the medium using the NiCr or AlTi reflective film can provide the jitter nearly equal to that before exposure to high temperature and high humidity. However, in the medium using the AgPdCu reflective film, the jitter largely deteriorates from 10.5% before exposure to 15.1% after exposure. Under an optical microscope, it was observed that the medium using the AgPdCu reflective film after exposure has pitting corrosion. It is found that the use of the AgPdCu reflective film has a problem in the corrosion resistance.

Embodiment 2

Like the Embodiment 1, an optical information recording medium is fabricated. However, the reflective film is a 60 wt % Ni-40 wt % Cr film and has a thickness of 80 nm. A ZnS—SiO$_2$ protective film having a thickness of 45 nm, a Ge$_2$Sb$_2$Te$_5$ recording film having a thickness of 14 nm, and a ZnS—SiO$_2$ protective film having a thickness of 105 nm are successively sputtered and laminated in the described order on the reflective film. After initialization, the medium is spun at a linear velocity of 5.5 m/s and an optical head with an objective lens, of which NA is 0.85 and the wavelength is 400 nm, is used. Thus, information is recorded on the medium at a linear density of 0.116 $\mu$m/bit to evaluate the jitter. As a result, a good jitter of 8.9% was obtained. Moreover, even when the medium is held for 1000 hours in the environment of 80° C. and a relative humidity of 85%, a good jitter of 9.8% was obtained.

Embodiment 3

Like the Embodiment 1, an optical information recording medium is fabricated. However, the reflective film is a 90 wt % Ni-10 wt % Cr film and has a thickness of 60 nm. A ZnS—SiO$_2$ protective film having a thickness of 45 nm, a Ge$_2$Sb$_2$Te$_5$ recording film having a thickness of 14 nm, and a ZnS—SiO$_2$ protective film having a thickness of 105 nm are successively sputtered and laminated on the reflective film in the described order. After initialization, the medium is spun at a linear velocity of 5.5 m/s and an optical head with an objective lens, of which NA is 0.85 and the wavelength is 415 nm, is used. Thus, information is recorded on the medium at a linear density of 0.116 $\mu$m/bit to evaluate the jitter. Thus, a good jitter of 8.4% was obtained. Moreover, even when the medium is held for 1000 hours in the environment of 80° C. and a relative humidity of 85%, a good jitter of 9.2% was obtained.

COMPARATIVE EXAMPLE 3

Like the Embodiment 1, an optical information recording medium is fabricated. However, the reflective film is a 50 wt % Ni-50 wt % Cr film and has a thickness of 70 nm. A ZnS—SiO$_2$ protective film having a thickness of 45 nm, a Ge$_2$Sb$_2$Te$_5$ recording film having a thickness of 14 nm, and a ZnS—SiO$_2$ protective film 105 nm are successively sputtered and laminated on the reflective film in the described order. After initialization, the medium is spun at a linear velocity of 5.5 m/s and an optical head with an objective lens, of which NA is 0.85 and the wavelength is 400 nm, is used. Thus, information is recorded on the medium at a linear density of 0.116 $\mu$m/bit to evaluate the jitter. As a result, a good jitter of 8.7% was obtained. However, after the medium is held for 1000 hours in the environmental of 80° C. and a relative humidity of 85%, the jitter is degraded to 14.7%. It was found that the medium has a problem in the corrosion resistance.

COMPARATIVE EXAMPLE 4

Like the Embodiment 1, an optical information recording medium is fabricated. However, the reflective film is a 95 wt % Ni-5 wt % Cr film and has a thickness of 70 nm. A ZnS—SiO$_2$ protective film having a thickness of 45 nm, a Ge$_2$Sb$_2$Te$_5$ recording film having a thickness of 14 nm, and a ZnS—SiO$_2$ protective film 105 nm are successively sputtered and laminated on the reflective film in the described order. After initialization, the medium is spun at a linear velocity of 5.5 m/s and an optical head with an objective lens of which NA is 0.85 and the wavelength is 400 nm, is used. Thus, information is recorded on the medium at a linear density of 0.116 $\mu$m/bit to evaluate the jitter. Thus, a good jitter of 8.5% was obtained. However, after the medium is held for 1000 hours in the environment of 80° C. and a relative humidity of 85%, the jitter was degraded to 16.4%. It is found that the medium has a problem in the corrosion resistance.

Judging from the embodiments 2 and 3 and the comparative examples 3 and 4, it is understood that contents of Ni between 60 wt % and 90 wt % are preferable for the Ni-Cr composition.

Embodiment 4

Like the Embodiment 1, an optical information recording medium is fabricated. However, the reflective film is a 60 wt % Ni-17 wt % Cr-23 wt % Fe film and has a thickness of 50 nm. A ZnS—SiO$_2$ protective film having a thickness of 45 nm, a Ge$_2$Sb$_2$Te$_5$ recording film having a thickness of 14 nm, and a ZnS—SiO$_2$ protective film having a thickness of 105 nm are successively sputtered and laminated on the reflective film in the described order. After initialization, the medium is spun at a linear velocity of 5.5 m/s and an optical head with an objective lens of which NA is 0.85 and the wavelength is 410 nm, is used. Thus, information is recorded on the medium at a linear density of 0.116 μm/bit to evaluate the jitter. As a result, a good jitter of 8.5% was obtained. Moreover, after the medium is held for 1000 hours in the environment of 80° C. and a relative humidity of 85%, a good jitter of 10.1% was obtained.

Embodiment 5

A PC substrate, which has a thickness of 1.2 mm, an outer diameter of 120 mm, and an inner diameter of 15 mm and on which pits corresponding to information lines each having a bit length of 0.145 μm are formed, is prepared as a support substrate. An 80 wt % Ni-20 wt % Cr alloy reflective film having a thickness of 10 nm to 100 nm is sputtered and laminated on the support substrate. A PC film of a thickness of 0.1 mm, acting as a light transmission layer, is adhered with the 80 wt % Ni-20 wt % Cr alloy reflective film, using an UV cure resin. Thus, an optical information recording medium is fabricated. The medium is spun at a linear velocity of 4 m/s and an optical head with an objective lens, of which NA is 0.85 and the wavelength is 405 nm, is used. Thus, information is reproduced to measure the jitter. The results are shown in FIG. 5.

Figure 5:
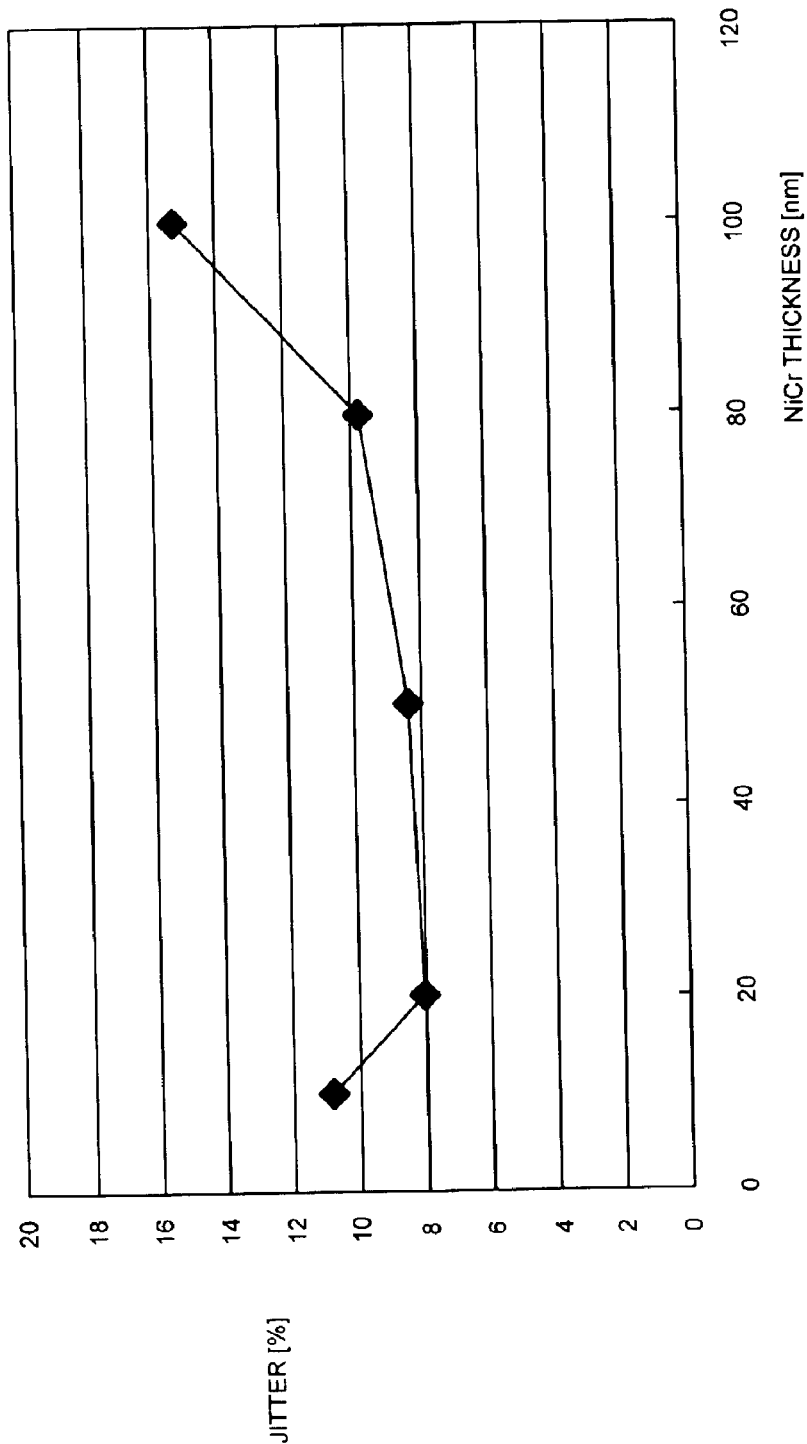
FIG. 5 is a graph plotting a relationship between a reflective film thickness and a jitter in a reproduction-only optical information recording medium according to the present invention.

As shown in FIG. 5, good jitter is obtained in the range where the reflective film thickness is 20 nm to 80 nm. However, the experimental result indicates that the jitter is large when the reflective film is 10 nm and 100 nm in thickness. It is understood that when the reflective film is 10 nm or 100 nm in thickness, the high noise causes deterioration of jitter.

Embodiment 6

A PC substrate, which has a thickness of 0.6 mm, an outer diameter of 120 mm, and an inner diameter of 15 mm and on which first pits corresponding to information lines each having a bit length of 0.14 μm with a groove pitch of 0.4 μm are formed, is prepared as a support substrate. An 80 wt % Ni-20 wt % Cr alloy reflective film acting as a first reflective film and having a thickness of 50 nm is sputtered and laminated on the side of the surface of the support substrate, on which first pits are formed. A ZnS—SiO$_2$ acting as a second reflective film of a thickness of 40 nm is sputtered and laminated on the side of pit lines in the PC light transmission layer. The PC light transmission layer has a thickness of 0.6 mm, an outer diameter of 120 mm, and an inner diameter of 15 mm and has second pits corresponding to information lines each having a bit length of 0.14 μm, formed thereon. The support substrate and the light transmission layer are adhered together with an UV cure resin, in such a way that the first recording layer and the second recording layer confront each other. The first and second recording layers form an intermediate layer of 40 μm in thickness. Finally, an optical information recording medium is fabricated. The medium completed is spun at a linear velocity of 5.5 m/s and an optical head with an objective lens of which NA is 0.65 and the wavelength is 405 nm, is used. The optical head irradiates light from the light transmission layer through the second recording layer, so that the jitter after reproduction of the first recording layer is measured. Thus, a good jitter of 10.3% was obtained.

COMPARATIVE EXAMPLE 5

Like the Embodiment 6, an optical information recording medium is fabricated. However, the reflective film is an Al-0.5 wt % Ti film (where Ti is 0.5 wt % and the remainder is Al) and has a thickness of 80 nm. The medium is spun at a linear velocity of 5.5 m/s and an optical head with an objective lens of which NA is 0.65 and the wavelength is 405 nm, is used. In order to measure the jitter, the optical head irradiates light from the light transmission layer through the second recording layer and thus reproduces the first recording medium. As a result, it is found that the jitter is as large as 18.6% and good reproduction cannot be achieved.

Embodiment 7

A PC substrate, which has a thickness of 1.2 mm, an outer diameter of 120 mm and an inner diameter of 15 mm and on which first pits corresponding to information lines each having a groove pitch of 0.14 μm with a groove pitch of 0.36 μm are formed, is prepared as a support substrate. A 80 wt % Ni-20 wt % Cr alloy reflective film acting as a first reflective film, having a thickness of 50 nm, is sputtered and laminated on the support substrate, so that a first recording layer is formed. Thereafter, an intermediate layer having a thickness of 30 μm and second pits corresponding to information lines each having a bit length of 0.14 μm are formed by using the 2P method. A ZnS—SiO$_2$ acting as a second reflective film having a thickness of 40 nm is sputtered and laminated over the second pits. Thus, a second recording layer is formed. A PC film having a thickness of 0.085 mm is placed on the second recording layer and they are adhered with each other using an UV cure resin. Thus, an optical information recording medium is fabricated. The medium is spun at a linear velocity of 5.5 m/s and an optical head with an objective lens, of which NA is 0.85 and the wavelength is 405 nm, is used. The optical head irradiates light through the second recording layer from the side of the light transmission layer and thus reproduces the first recording layer. In measurement, a good jitter of 9.8% was obtained.

Embodiment 8

A PC substrate, which has a thickness of 0.6 mm, an outer diameter of 120 mm, and an inner diameter of 15 mm and on which guide grooves having a groove pitch of 0.72 μm (corresponding to the pitch for land/groove recording of 0.36 μm) are formed, is prepared as a support substrate. A 80 wt % Ni-20 wt % Cr alloy reflective film having a thickness of 70 nm, a ZnS—SiO$_2$ protective film having a thickness of 45 nm, a Ge$_4$Sb$_2$Te$_7$ recording film having a thickness of 14 nm, and a ZnS—SiO$_2$ protective film having a thickness of 105 nm are successively sputtered and laminated on the support substrate. Thus, a first recording layer is formed. Moreover, a PC light transmission layer, which has a thickness of 0.6 mm, an outer diameter of 120 mm, and an inner diameter of 15 mm and on which guide grooves having a groove pitch of 0.72 μm (corresponding to the pitch for land/groove recording of 0.36 μm) are formed, is prepared. A ZnS—SiO$_2$ protective film having a thickness of 50 nm, a Ge$_4$Sb$_2$Te$_7$ recording film having a thickness of 7 nm, and a ZnS—SiO$_2$ protective film having a thickness of 55 nm are successively sputtered and laminated over the grooves in the PC light transmission layer. Thus, a second recording layer is formed.

The support substrate having the first recording layer and the light transmission layer having the second recording layer are adhered together using an UV cure resin, in such a way that the two recording layers confront each other. Finally, an optical information recording medium having an intermediate layer having a thickness of 35 μm is fabricated. The medium is spun at a linear velocity of 5.5 m/s and an optical head with an objective lens, of which NA is 0.65 and the wavelength is 405 nm, is used. The optical head irradiates light through the second recording layer from the light transmission layer side. Information is recorded on the first recording layer at a linear density of 0.116 μm/bit to measure jitter. As a result, a good jitter of 10.8% was obtained.

As described above, in the optical information recording medium according to the present invention, the reflective film has Ni and Cr as principal components and has a thickness of 20 nm to 80 nm. At least the reflective film and a light transmission layer are successively formed on the information recording surface of the support substrate. Information is recorded and/or reproduced by the laser beam irradiated from the light transmission layer side. The optical information recording medium can provide a high signal quality, a large capacity, a high reliability, and cost reduction.

The entire disclosure of Japanese Patent Application No. 2002-106448 filed on Apr. 9, 2002 including a specification, claims, drawings and summary are incorporated herein by reference in its entirely.

What is claimed is:

1. A read-only optical information recording medium, which reproduces information by irradiating a laser beam, comprising:

a reflective film formed on an information recording surface of a support substrate and in which information are previously formed in pit lines, said reflective layer being formed of an alloy containing Ni and Cr as main components, said reflective film having a thickness of 20 nm or more to 80 nm or less; and a light transmission layer formed on said reflective film, wherein information is reproduced with the laser beam incident on a surface of said light transmission layer opposite said reflective film.

2. A read-only optical information recording medium, which reproduces information by irradiating a laser beam, comprising:

a first recording layer, formed on a support substrate, including first pit lines and a reflective film, said reflective film being formed of an alloy containing Ni and Cr as main components, said reflective film having a thickness of 20 nm or more to 80 nm or less;

an intermediate layer formed on said first recording layer;

a second recording layer, formed on said intermediate layer, including second pit lines and a second reflective film; and a light transmission layer formed on said second recording layer, wherein information is reproduced with the laser beam incident on a surface of said light transmission layer opposite said reflective film.

* * * * *